(12) United States Patent
Bartoschewski et al.

(10) Patent No.: US 7,738,178 B2
(45) Date of Patent: Jun. 15, 2010

(54) LASER ASSEMBLY

(75) Inventors: Daniel Bartoschewski, Gelsenkirchen (DE); Björn Langer, Olfen (DE)

(73) Assignee: Limo Patentverwaltung GmbH & Co. KG, Gerstengrund (DE)

( * ) Notice: Subject to any disclaimer, the term of this patent is extended or adjusted under 35 U.S.C. 154(b) by 0 days.

(21) Appl. No.: 12/033,418

(22) Filed: Feb. 19, 2008

(65) Prior Publication Data

US 2008/0198893 A1 Aug. 21, 2008

Related U.S. Application Data

(63) Continuation of application No. PCT/EP2005/009011, filed on Aug. 19, 2005.

(51) Int. Cl.
*G02B 27/30* (2006.01)
(52) U.S. Cl. .................. 359/641; 359/619; 359/630; 372/92; 372/98; 372/101
(58) Field of Classification Search .......... 372/92–108; 359/362–435, 618–884
See application file for complete search history.

(56) References Cited

U.S. PATENT DOCUMENTS

| | | | | |
|---|---|---|---|---|
| 4,530,574 | A | * | 7/1985 | Scifres et al. ............... 359/668 |
| 5,258,989 | A | * | 11/1993 | Raven ........................... 372/6 |
| 6,044,096 | A | * | 3/2000 | Wolak et al. .................. 372/36 |
| 6,124,973 | A | | 9/2000 | Du et al. |
| 6,665,471 | B1 | | 12/2003 | Farmer et al. |
| 2002/0051360 | A1 | * | 5/2002 | Solodovnikov et al. ..... 362/244 |

FOREIGN PATENT DOCUMENTS

| | | |
|---|---|---|
| EP | 1168529 A1 | 1/2002 |
| WO | 2005063433 A1 | 7/2005 |

OTHER PUBLICATIONS

Bludau, W; Gündner, H. M.; Kaiser, M, "Systemgrundlagen und Messtechnik in der optischen Übertragungstechnik", p. 73, paragraph 2.1.1.2—p. 75, published in 1985 by B.G. Teubner, Stuttgart, Germany (XP-002377901).
International Search Report dated Apr. 24, 2006.

* cited by examiner

*Primary Examiner*—Minsun Harvey
*Assistant Examiner*—Xnning Niu
(74) *Attorney, Agent, or Firm*—Laurence A. Greenberg; Werner H. Stemer; Ralph E. Locher

(57) ABSTRACT

A laser assembly is suitable for coupling laser light into at least one optical fiber. The laser assembly contains a plurality of laser light sources disposed spaced from a light entrance surface of the at least one optical fiber. The laser light sources are divided into at least one group of first laser light sources and at least one group of second laser light sources. An aperture is provided and is suitable for spatially confining the laser light emitted during operation of the laser light sources before being coupled into the at least one optical fiber. A coupling device is provided and is suitable for coupling the laser light during operation of the first and second laser light sources before it enters into the at least one optical fiber.

12 Claims, 1 Drawing Sheet

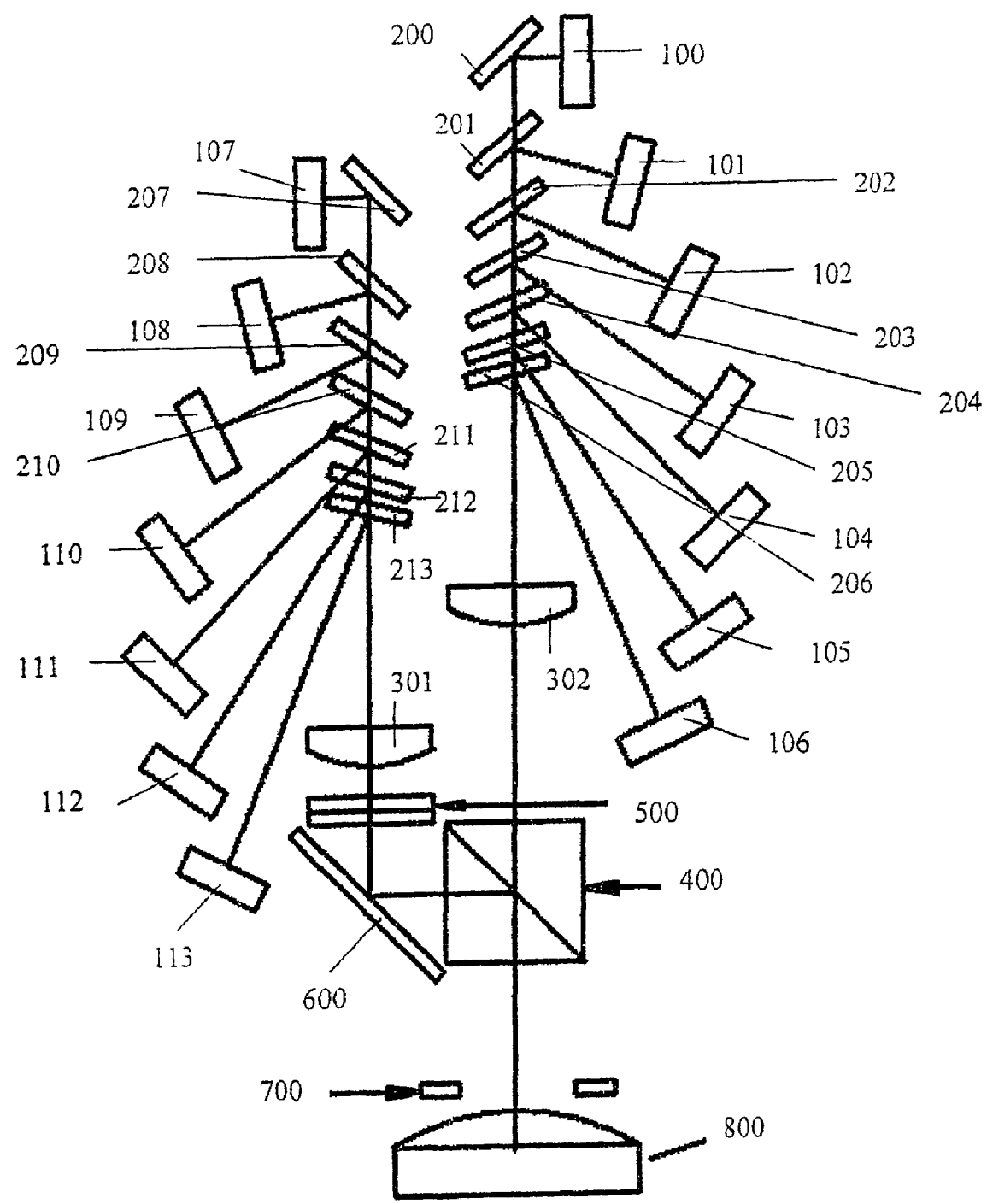

LASER ASSEMBLY

CROSS-REFERENCE TO RELATED APPLICATION

This is a continuation, under 35 U.S.C. §120, of copending international application No. PCT/EP2005/009011, filed Aug. 19, 2005, which designated the United States; the prior application is herewith incorporated by reference in its entirety.

BACKGROUND OF THE INVENTION

Field of the Invention

The invention relates to a laser assembly that is suitable for coupling laser light into at least one optical fiber. The laser assembly contains a plurality of laser light sources, which are disposed spaced from a light entrance surface of the at least one optical fiber, and an aperture, which is suitable for spatially confining the laser light emitted during operation of the laser light sources, before it is coupled into the at least one optical fiber.

Laser assemblies of the type initially described are known in principle in the prior art. In the past, for high-powered laser diode systems with fiber coupling, laser diode bars or individual laser diodes (so-called single emitters) have been used as the beam sources, and have been disposed in such a way that the distances of the beam sources from the light entrance surface of the optical fibers are different. If the resulting laser light beam is confined with only a single aperture before being focused onto the light entrance surface of the optical fibers, in the known laser assemblies an optimized result in terms of the spatial distribution of the laser light cannot be achieved. With known laser assemblies, astigmatism errors frequently occur, which can impede coupling of the laser light into the optical fiber. A further disadvantage of known laser assemblies relates in the fact that they frequently require a relatively large amount of space due to a plurality of optical elements.

This is the concern of the present invention.

BRIEF SUMMARY OF THE INVENTION

It is accordingly an object of the invention to provide a laser assembly, which overcomes the above-mentioned disadvantages of the heretofore-known devices of this general type and in which astigmatism errors can be prevented in a simple manner, and which requires a relatively small amount of space.

With the foregoing and other objects in view there is provided, in accordance with the invention, a laser assembly for coupling laser light into at least one optical fiber. The laser assembly contains a plurality of laser light sources disposed spaced from a light entrance surface of the at least one optical fiber. The plurality of laser light sources includes at least one group of first laser light sources and at least one group of second laser light sources. An aperture is provided for spatially confining the laser light emitted during operation of the laser light sources before being coupled into the at least one optical fiber. A coupling device is provided for coupling the laser light during operation of the first and second laser light sources before the laser light enters into the at least one optical fiber.

According to the invention it is proposed that the laser light sources contain at least one group of first laser light sources and at least an additional group of second laser light sources, and that the laser assembly has a coupling device that is suitable for coupling the laser light together during operation of the first and second laser light sources, prior to entry into the at least one optical fiber. By dividing the laser light sources into two groups of first and second laser light sources, which can be operated independently of one another, and by providing the coupling device, a largely astigmatism-free laser assembly for coupling laser light into an optical fiber can be made available in a simple manner.

In one particularly preferred embodiment it is proposed that the laser light sources of at least one of the groups of first and second laser light sources are disposed spaced from one another in a vertical direction. In this manner, the amount of space required for the laser assembly can be decreased. Preferably, both the respective adjacent first laser light sources and the respective adjacent second laser light sources are spaced from one another vertically, so that the space required for the laser assembly can be kept relatively small.

For example, it can be provided that the vertical distance between adjacent first and second laser light sources is at least 1.0 mm. For example, the distance between adjacent first and/or second laser light sources can be approximately 1.1 mm.

In one particularly preferred embodiment it is proposed that each of the first and second laser light sources is equipped with at least one reflective element, which is suitable for reflecting the laser light emitted by the first and second laser light sources in the direction of a shared main propagation direction for the respective group of first and/or second laser light sources. In this manner, the laser assembly can be more compact in structure, so that the amount of space it requires can be decreased even further.

In one advantageous embodiment, each of the first and second laser light sources is assigned at least one fast-axis collimation device. In this way a collimation of the laser light in the fast-axis direction (fast direction) can be achieved, allowing the beam quality to be improved.

According to one preferred embodiment, it is possible for the fast-axis collimation device to contain at least one cylindrical lens.

Advantageously, at least one of the groups of first and second laser light sources is assigned at least one slow-axis collimation device. With this measure, the light emitted by the laser light sources can also be collimated in the slow-axis (slow direction). In this manner, the beam quality of the laser light can be further improved before being coupled into the optical fiber.

It is possible for the slow-axis collimation device to contain at least one cylindrical lens.

A preferred further improvement on the invention is characterized in that at least one of the groups of laser light sources is assigned at least one phase delay device. The phase delay device, which is positioned in the beam path of the first and/or second laser light sources, enables a targeted change in polarization of the laser light emitted by the first and/or second laser light sources.

For example, the phase delay device can be a $\lambda/2$ delay element. This effects a rotation of the polarization plane of the laser light by 90°.

In one particularly advantageous embodiment, it can be provided that the coupling device contains at least one polarization coupling device, which is suitable for coupling the laser light emitted by the group of first laser light sources with the laser light emitted by the group of second laser light sources. In this manner, the laser light emitted by the first and second laser light sources can be coupled in a simple manner via the polarization of the laser light.

The polarization coupling device is preferably a polarization beam splitter.

In one particularly advantageous embodiment, the coupling device has at least one beam deflection device, which is suitable for deflecting the laser light emitted by at least one of the groups of first and second laser light sources in the direction of the polarization coupling device. For example, the main propagation directions of the laser light emitted by the first and second laser light sources can run substantially parallel to one another. In order to couple the laser light in the polarization coupling device, the beam deflection device be configured, for example, to deflect the laser light by 90°.

The beam deflection device preferably contains at least one reflecting element.

In one particularly preferred embodiment, the laser assembly has at least one spherical lens element, which is positioned behind the aperture in the beam propagation direction and is suitable for focusing the coupled laser light from the first and second laser light sources onto the light entrance surface of the at least one optical fiber. In this manner, effective focusing and therefore a relatively low-loss coupling of the laser light into the optical fiber can be achieved.

Other features which are considered as characteristic for the invention are set forth in the appended claims.

Although the invention is illustrated and described herein as embodied in a laser assembly, it is nevertheless not intended to be limited to the details shown, since various modifications and structural changes may be made therein without departing from the spirit of the invention and within the scope and range of equivalents of the claims.

The construction of the invention, however, together with additional objects and advantages thereof will be best understood from the following description of the specific embodiment when read in connection with the accompanying drawings.

BRIEF DESCRIPTION OF THE DRAWING

The single FIGURE of the drawing is a diagrammatic, simplified schematic view of a laser assembly according to a preferred embodiment of the invention.

DESCRIPTION OF A PREFERRED EMBODIMENT OF THE INVENTION

Referring now to the single FIGURE of the drawing in detail thereof, there is shown a laser assembly, which is suitable for coupling laser light into an optical fiber, contains a plurality of laser light sources 100-113, which are disposed at a distance from a light entrance surface of an optical fiber, not explicitly represented in the FIGURE. In the exemplary embodiment the laser assembly has a total of fourteen laser light sources 100-113. The laser light sources 100-113 are preferably individual semiconducting laser diodes (so-called single emitters), whose light exit surfaces can have a width of approximately 100 μm, for example, and which can each have wattage of approximately 4 watts. According to a variant of the present invention that is not shown here, it is also possible to use laser diode bars as the laser light sources.

Each of the laser light sources 100-113 is assigned a fast-axis collimation device, which is positioned in front of the approximately 100-μm-wide light exit surface of the corresponding laser light source 100-113. To simplify the illustration, the laser light sources 100-113 and the fast-axis collimation devices assigned to each are indicated schematically as single components in the FIGURE. The fast-axis collimation device can contain, for example, at least one cylindrical lens, and enable a collimation of the laser light emitted by the laser light sources 100-113 in the so-called fast axis in order to improve beam quality.

Further, each of the laser light sources 100-113 is assigned a reflective device 200-213, which is positioned, spaced from the respective laser light source 100-113, in the beam path of the laser assembly. Each of the reflective devices 200-213 can contain, for example, at least one reflecting element.

It is apparent that in the laser assembly presented here, the laser light sources 100-113 are divided into a group of first laser light sources 100-106 and a group of second laser light sources 107-113. As was already mentioned above, each of the laser light sources 100-113 of the two groups of first and second laser light sources 100-106, 107-113 is assigned one of the reflective elements 200-206 or 207-213, respectively.

In this, the reflective elements 200-206 are disposed in the beam path of the laser assembly in relation to the first laser light sources 100-106 assigned to them, and are each rotated in relation to a vertical axis that extends outside of the symbol plane, in such a way that the light emitted by the first laser light sources 100-106 can propagate substantially in a z-direction after being reflected on the reflective elements 200-206 respectively assigned to them. Moreover, the first laser light sources 100-106 in this exemplary embodiment are disposed offset in relation to one another in the vertical direction, and therefore in terms of height. In this, the first laser light sources 100-106 can be disposed offset in relation to one another, for example, in a vertical direction and therefore in terms of height by approximately 1.1 mm. Alternatively or additionally, it is also possible to use reflective elements 200-206 that are differently dimensioned, especially in a vertical direction. The arrangement of the first laser light sources 100-106 offset in height relative to one another results in that the laser light emitted by the first laser light sources 100-106 can propagate in different reflection planes that are spaced from one another, each of which is spanned by the propagation directions of the laser beams that strike the reflective elements 200-206 and are reflected by these. In this manner, a relatively compact structure can be achieved for the laser assembly. In what follows, the propagation direction of the laser light after reflection on the reflective elements 200-206 will also be referred to as the main propagation direction of the laser light of the group of first laser light sources 100-106.

The second laser light sources 107-113 are also correspondingly height-offset in a vertical direction relative to one another. In this, adjacent second laser light sources 107-113 can be positioned offset in relation to one another, for example in a vertical direction and therefore in height, by approximately 1.1 mm. Correspondingly, the reflective elements 207-213 can also be disposed offset vertically in relation to one another by approximately 1.1 mm. Alternatively or additionally, it is also possible to use reflective elements 207-213 that are differently dimensioned, especially in a vertical direction. The height-offset arrangement of the second laser light sources 107-113 results in that the laser light emitted by the second laser light sources 107-113 can also propagate in different reflection planes that are spaced from one another. The reflective elements 207-213, which are assigned to the second laser light sources 107-113, are thus disposed in the beam path of the laser assembly and rotated respectively around a vertical axis in such a way that the laser light that is emitted during operation of the second laser light sources 107-113 can also propagate substantially in the z-direction, specifically substantially parallel to the main propagation direction of the laser light emitted by the first laser light sources 100-106. In what follows, this propagation direction will be referred to as the main propagation direction of the group of second laser light sources 107-113.

In the main propagation direction of the first group of laser light sources 100-106, behind the reflective element 206 assigned to laser light source 106, a first slow-axis collimation device 300 is positioned. The first slow-axis collimation device 300 is suitable for collimating the laser light that is emitted by the first laser light sources 100-106 and reflected in the main propagation direction by the reflective element 200-206 in the so-called slow axis, in order to improve the beam quality. The first slow-axis collimation device 300 can contain at least one cylindrical lens, for example.

Correspondingly, a second slow-axis collimation device 301 is positioned in the beam path of the laser assembly in the main propagation direction of the second group of laser light sources 107-113, behind the reflective element 213, which is assigned to the laser light source 113, and is suitable for collimating the laser light emitted by the second laser light sources 107-113 and reflected in the main propagation direction by the reflective elements 207-213 in the slow-axis direction. The second slow-axis collimation device 301 can also contain at least one cylindrical lens, for example.

To combine the laser light of the two groups of first and second laser light sources 100-106, 107-113 prior to coupling into the optical fiber, the laser assembly has a coupling device, which is suitable for coupling the laser light emitted by the first and second laser light sources 100-106, 107-113 before this is coupled into the light entrance surface of the optical fiber.

In this exemplary embodiment, the coupling device contains a polarization coupling device 400, which can, for example, be a conventional polarization beam splitter, and a beam deflection device 500. In addition, in the beam path of the second laser light sources 107-113 a phase delay device 600 is provided, which in this exemplary embodiment is a λ/2 delay element. The light emitted by the second laser light sources 107-113, which propagates in the main propagation direction through the second slow-axis collimation device 301, after reflection on the corresponding reflective elements 207-213, passes through the phase delay device 600, in which it undergoes a 90° rotation of the direction of polarization by virtue of the λ/2 delay element.

The laser light is then reflected 90° in the direction of the polarization coupling device 400 with the help of the beam deflection element 500, which can contain at least one reflecting element, for example. In the polarization coupling device 400 the laser light from the second laser light sources 107-113 deflected on the beam deflection element 500 is coupled with the laser light emitted by the first laser light sources 100-106 via polarization. It is apparent that the coupling of the laser light in this exemplary embodiment occurs both geometrically and through polarization. As a result, within the polarization coupling device 400 the laser light, which is emitted by the first laser light sources 100-106 is coupled with the laser light emitted by the second laser light sources 107-113, and then propagates in the z-direction through an aperture 700, which is positioned behind the polarization coupling device 400 in the direction of beam propagation, and then strikes a spherical lens element 800, which focuses the laser light onto the light entrance surface of the optical fiber, not explicitly shown here, so that the laser light can be coupled at high power into the optical fiber.

The laser assembly shown here provides an anastigmatic arrangement of laser light sources 100-113, and its special configuration enables the blocking out of laser beams that strike the optical fibers in the slow axis at overly large angles. In this manner, the optical fiber can be prevented from being heated beyond a tolerable level by laser light that is incident at overly large angles or that strikes a fiber sheath of the optical fiber, which can damage the fiber under certain circumstances.

It is apparent that the laser assembly requires only a single aperture 700, which is positioned in front of the spherical lens element 800 in the beam propagation direction. Using the laser assembly shown here, in which the laser light is coupled both geometrically and via polarization, a laser spot having a diameter of less than approximately 50 μm half-width can be provided in both the fast and slow axes.

The number of lenses used in the exemplary embodiment shown here can also be kept relatively low and the overall space required for the laser assembly can be reduced. The laser assembly in this exemplary embodiment requires only fourteen fast-axis collimation devices, along with two slow-axis collimation devices 300, 301 and only a single spherical lens element 800, which is suitable for focusing the laser light onto the light entrance surface of the optical fiber.

In the exemplary embodiment shown here, nearly quadratic ratios of the size of the light spot and the divergence in the fast and slow axes are achieved, so that a generally anastigmatic focusing of both axes is enabled using only one spherical lens element 800. Thus a laser assembly for coupling laser light into an optical fiber can be provided, which permits a testing of the coupling efficiency in optical fibers having a fiber core diameter of 50 μm to 100 μm and a numerical aperture (NA) of approximately 0.22.

The invention claimed is:

1. A laser assembly for coupling laser light into at least one optical fiber, the laser assembly comprising:
    a plurality of laser light sources disposed spaced from a light entrance surface of the at least one optical fiber, said plurality of laser light sources including at least one group of first laser light sources and at least one group of second laser light sources;
    an aperture suitable for spatially confining the laser light emitted during operation of said laser light sources before being coupled into the at least one optical fiber;
    a coupling device for coupling the laser light during operation of said first and second laser light sources before the laser light enters into the at least one optical fiber; and
    at least one phase delay element associated with at least one of said groups of said first and second laser light sources;
    said coupling device having at least one polarization coupling device for coupling the laser light emitted by said group of first laser light sources with the laser light emitted by said group of second laser light sources; and
    said coupling device having at least one beam deflection device for deflecting the laser light emitted by at least one of said groups of first and second laser light sources in a direction of said polarization coupling device.

2. The laser assembly according to claim 1, wherein said laser light sources of at least one of said groups of said first and second laser light sources are disposed spaced from one another in a vertical direction.

3. The laser assembly according to claim 2, wherein a vertical distance between adjacent first and second laser light sources is at least 1.0 mm.

4. The laser assembly according to claim 1, further comprising reflective elements, each of said first and second laser light sources is assigned at least one of said reflective elements, being suitable for reflecting the laser light emitted by said first and second laser light sources in a direction of a shared main propagation direction for a respective group of said first said second laser light sources.

5. The laser assembly according to claim 1, further comprising fast-axis collimation devices, each of said laser light sources is assigned at least one of said fast-axis collimation devices.

6. The laser assembly according to claim 5, wherein each of said fast-axis collimation devices has at least one cylindrical lens.

7. The laser assembly according to claim 1, further comprising at least one slow-axis collimation device associated with at least one of said groups of said first and second laser light sources.

8. The laser assembly according to claim 7, wherein said at least one slow-axis collimation device has at least one cylindrical lens.

9. The laser assembly according to claim 1, wherein said at least one phase delay element is a $\lambda/2$ delay element.

10. The laser assembly according to claim 1, wherein said at least one polarization coupling device has a polarization beam splitter.

11. The laser assembly according to claim 1, wherein said beam deflection device contains at least one reflecting element.

12. The laser assembly according to claim 1, further comprising at least one spherical lens element, positioned behind said aperture in a beam propagation direction, for focusing coupled laser light from said first and second laser light sources onto the light entrance surface of the at least one optical fiber.

* * * * *